United States Patent
Ryu

(10) Patent No.: US 12,193,285 B2
(45) Date of Patent: Jan. 7, 2025

(54) DISPLAY PANEL, DISPLAY DEVICE INCLUDING THE SAME, AND METHOD OF MANUFACTURING THE SAME

(71) Applicant: Samsung Display Co., Ltd., Yongin-si (KR)

(72) Inventor: Seung-Soo Ryu, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 423 days.

(21) Appl. No.: 17/545,857

(22) Filed: Dec. 8, 2021

(65) Prior Publication Data

US 2022/0310762 A1    Sep. 29, 2022

(30) Foreign Application Priority Data

Mar. 25, 2021    (KR) .......................... 10-2021-0038745

(51) Int. Cl.
*H10K 59/131*    (2023.01)
*H10K 59/12*    (2023.01)
*H10K 59/18*    (2023.01)

(52) U.S. Cl.
CPC ........... *H10K 59/131* (2023.02); *H10K 59/18* (2023.02); *H10K 59/1201* (2023.02)

(58) Field of Classification Search
None
See application file for complete search history.

(56) References Cited

U.S. PATENT DOCUMENTS

| | | | | |
|---|---|---|---|---|
| 9,229,570 | B2 * | 1/2016 | Choi | G06F 3/0412 |
| 9,992,862 | B2 * | 6/2018 | Shin | G02B 6/0011 |
| 10,037,984 | B2 * | 7/2018 | Oh | H01L 24/00 |
| 2012/0319144 | A1 * | 12/2012 | Fujikawa | G02F 1/1345 |
| | | | | 257/E27.121 |
| 2019/0095007 | A1 * | 3/2019 | Jeong | H10K 59/873 |
| 2020/0077518 | A1 * | 3/2020 | Kim | H05K 1/118 |
| 2021/0280567 | A1 * | 9/2021 | Lin | H01L 25/167 |

FOREIGN PATENT DOCUMENTS

KR    10-1895217    9/2018

* cited by examiner

*Primary Examiner* — Mounir S Amer
(74) *Attorney, Agent, or Firm* — CANTOR COLBURN LLP

(57) ABSTRACT

A display panel may include a first substrate, a first line disposed on the first substrate, a second substrate disposed on the first line, including a first portion which overlaps the first substrate and a second portion which does not overlap the first substrate, and having a through-hole which exposes the first line, a second line disposed on the second substrate and electrically connected to the first line through the through-hole, a display unit disposed on the second substrate and electrically connected to the second line, and a printed circuit board disposed on a surface of the first substrate which faces the second substrate and electrically connected to the first line.

14 Claims, 10 Drawing Sheets

DISPLAY PANEL, DISPLAY DEVICE INCLUDING THE SAME, AND METHOD OF MANUFACTURING THE SAME

CROSS-REFERENCE TO RELATED APPLICATION(S)

This application claims priority from and the benefit of Korean Patent Application No. 10-2021-0038745, filed on Mar. 25, 2021, which is hereby incorporated by reference for all purposes as if fully set forth herein.

BACKGROUND

Field

Embodiments of the invention relate generally to a display device. More particularly, embodiments relate to a display panel, a tiled display device including the display panel, and a method of manufacturing the display panel.

Discussion of the Background

A display device may provide visual information to a user. In order to provide the visual information to a large number of users, the need for a display device having a large screen is increasing.

In order to provide the users with the large screen, the display device may include a plurality of display panels arranged in a matrix form. A display device including such display panels may be referred to as a tiled display device. Each of the display panels of the tiled display device displays an image, and accordingly, the tiled display device may provide a large image.

Each of the display panels may include a non-display area surrounding a display area, and the non-display area may form a boundary area in which an image is not displayed between the display panels in the tiled display device. When the boundary area, which separates the large screen, is visually recognized by the users, the display quality of the display device may be deteriorated.

The above information disclosed in this Background section is only for understanding of the background of the inventive concepts, and, therefore, it may contain information that does not constitute prior art.

SUMMARY

Devices constructed and methods performed according to embodiments of the invention are capable of providing a large viewing area for display by a plurality of display devices arranged in a tiled structure by having an increased size of a display area and a decreased size of a non-display area of each of the display devices that form the tiled structure.

Embodiments provide a display panel in which a non-display area decreases and a display device including the display panel.

Embodiments provide a method of manufacturing a display panel for decreasing or substantially preventing a damage of a display area.

Additional features of the inventive concepts will be set forth in the description which follows, and in part will be apparent from the description, or may be learned by practice of the inventive concepts.

A display panel according to an embodiment may include a first substrate, a first line disposed on the first substrate, a second substrate disposed on the first line, including a first portion which overlaps the first substrate and a second portion which does not overlap the first substrate, and having a through-hole which exposes the first line, a second line disposed on the second substrate and electrically connected to the first line through the through-hole, a display unit disposed on the second substrate and electrically connected to the second line, and a printed circuit board disposed on a surface of the first substrate which faces the second substrate and electrically connected to the first line.

In an embodiment, the printed circuit board may not overlap the display unit.

In an embodiment, the first substrate may include glass.

In an embodiment, a thickness of the second portion may be less than a thickness of the first portion.

In an embodiment, a difference between the thickness of the first portion and the thickness of the second portion may be greater than a thickness of the printed circuit board.

In an embodiment, the second substrate may include polymer resin.

In an embodiment, the second substrate may include a first substrate layer including the polymer resin, a second substrate layer disposed between the first substrate and the display unit and including the polymer resin, and a barrier layer disposed between the first substrate layer and the second substrate layer.

In an embodiment, the display unit may include a transistor including semiconductor layer, a gate electrode, a source electrode, and a drain electrode and a light emitting element electrically connected to the transistor.

In an embodiment, the second line may include the same material as at least one of the gate electrode, the source electrode, and the drain electrode.

A display device according to an embodiment may include a first display panel and a second display panel adjacent to the first display panel. Each of the first display panel and the second display panel may include a first substrate, a first line disposed on the first substrate, a second substrate disposed on the first line, including a first portion which overlaps the first substrate and a second portion which does not overlap the first substrate, and having a through-hole which exposes the first line, a second line disposed on the second substrate and electrically connected to the first line through the through-hole, a display unit disposed on the second substrate and electrically connected to the second line, and a printed circuit board disposed on a surface of the first substrate which faces the second substrate and electrically connected to the first line. The printed circuit board of the first display panel may overlap the second display panel.

In an embodiment, a thickness of the second portion may be less than a thickness of the first portion.

In an embodiment, the printed circuit board of the first display panel may overlap the second portion of the second substrate of the second display panel.

In an embodiment, the printed circuit board of the first display panel may be spaced apart from the second portion of the second substrate of the second display panel.

In an embodiment, the printed circuit board of the first display panel may not overlap the first substrate of the second display panel.

A method of manufacturing a display panel according to an embodiment may include forming a first line on the first substrate, forming a second substrate on the first line, forming a through-hole in the second substrate, the through-hole exposing the first line, forming a second line on the second substrate, the second line being electrically connected to the first line through the through-hole, forming a display unit on the second substrate, the display unit being electrically connected to the second line, removing a first portion of the second substrate to expose the first line, and bonding a printed circuit board on a surface of the first substrate which faces the second substrate, the printed circuit board being electrically connected to the first line.

In an embodiment, the first portion of the second substrate may be removed by an etching process.

In an embodiment, the method may further include removing a portion of the first substrate which does not overlap the first line.

In an embodiment, the method may further include removing a lower part of a second portion of the second substrate, the second portion of the second substrate overlapping the removed portion of the first substrate.

In an embodiment, a thickness of the removed lower part of the second portion of the second substrate may be greater than a thickness of the printed circuit board.

In an embodiment, the portion of the first substrate may be removed by a cutting process.

In the display panel and the display device including the display panel according to the embodiments, the printed circuit board electrically connected to the first display panel may overlap the second display panel adjacent to the first display panel, so that a non-display area between the first display panel and the second display panel may decrease. Accordingly, a seamless tiled display device may be implemented, and the display quality of the display device may be improved.

In the method of manufacturing the display panel according to the embodiments, the printed circuit board may be bonded on the surface of the first substrate which faces the second substrate, so that the printed circuit board may be bonded to the non-display area of the display panel. Accordingly, the display area of the display panel may not be damaged.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION OF THE EMBODIMENTS

Figure 1:
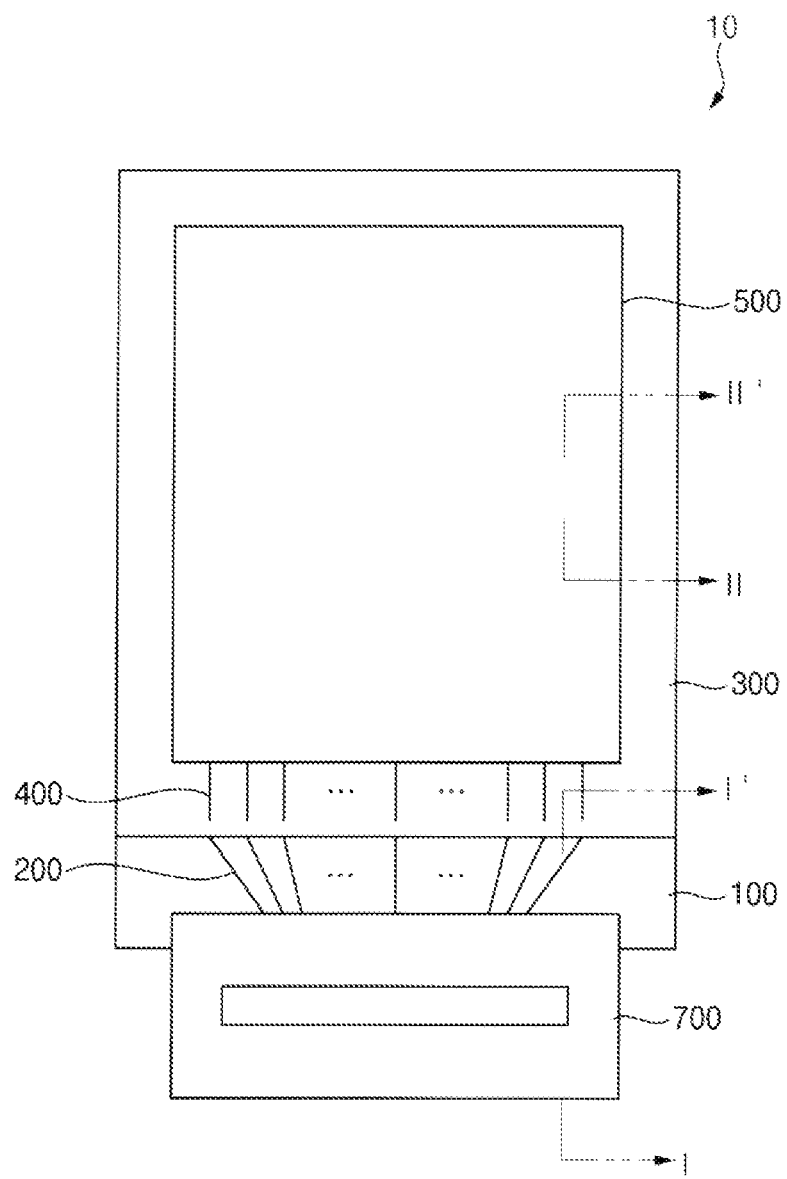
FIG. 1 is a diagram illustrating a front side of a display panel according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display panels, display devices, and methods of manufacturing display panels in accordance with embodiments will be explained in detail with reference to the accompanying drawings.

Figure 2:
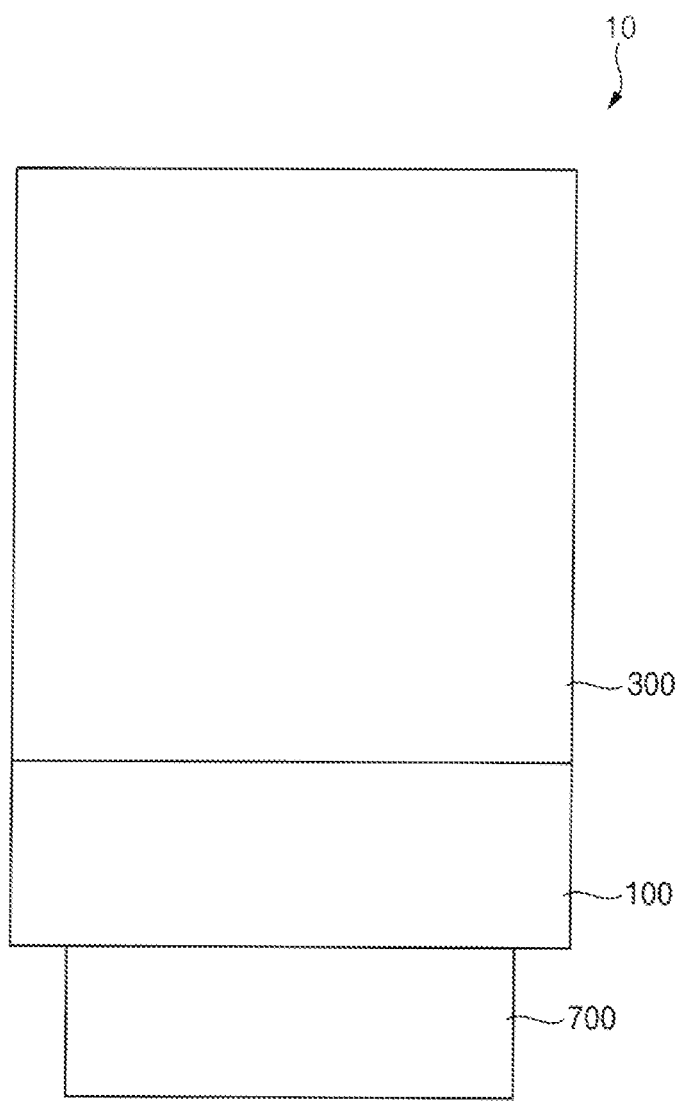
FIG. 2 is a diagram illustrating a bottom side of the display panel in FIG. 1.
Figure 3:
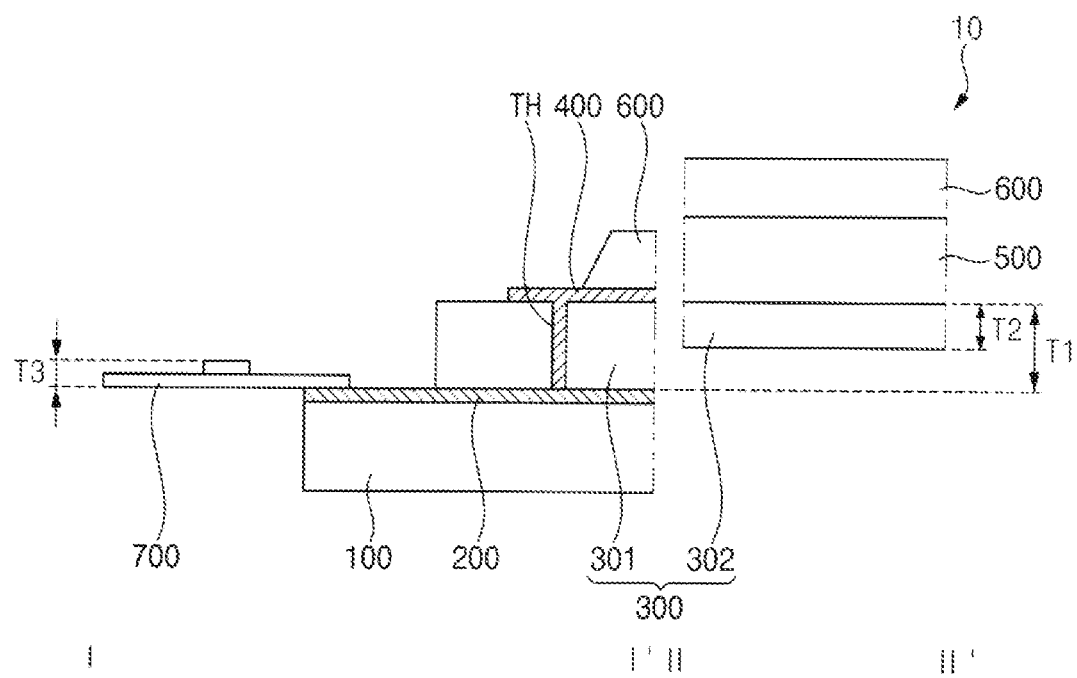
FIG. 3 is a cross-sectional view illustrating the display panel taken along lines I-I' and II-II' in FIG. 1.

FIG. 1 is a diagram illustrating a front side of a display panel 10 according to an embodiment that is constructed according to principles of the invention. FIG. 2 is a diagram illustrating a bottom side of the display panel 10 in FIG. 1. FIG. 3 is a cross-sectional view illustrating the display panel 10 taken along lines I-I' and II-II' in FIG. 1.

Referring to FIGS. 1, 2, and 3, a display panel 10 may include a first substrate 100, first lines 200, a second substrate 300, second lines 400, a display unit 500, an encapsulation layer 600, and a printed circuit board 700. Hereinafter, the display panel 10 will be mainly described as an organic light emitting display panel including an organic light emitting diode. However, the embodiments described herein are not limited thereto, and the display panel 10 may be a liquid crystal display panel including a liquid crystal element, a quantum dot display panel including a quantum dot nano-light emitting diode, or the like.

The first line 200 may be disposed on the first substrate 100. In an embodiment, the first substrate 100 may include glass. However, the embodiments described herein are not limited thereto, and in another embodiment, the first substrate 100 may include polymer resin.

The first line 200 may include a conductive material such as metal. The first line 200 may electrically connect the printed circuit board 700 and the second line 400. The first line 200 may transmit an electrical signal from the printed circuit board 700 to the display unit 500. In an embodiment, the first line 200 may transmit a data signal, a control signal, a power voltage, or the like.

The second substrate 300 may be disposed on the first line 200. In other words, the first line 200 may be interposed between the first substrate 100 and the second substrate 300. In an embodiment, the second substrate 300 may include polymer resin. However, the embodiments described herein are not limited thereto, and in another embodiment, the second substrate 300 may include glass.

The second substrate 300 may include a first portion 301 and a second portion 302. The first portion 301 may overlap the first substrate 100. The second portion 302 may be adjacent to the first portion 301, and may not overlap the first substrate 100. In other words, the first portion 301 may be a portion of the second substrate 300 which overlaps the first substrate 100, and the second portion 302 may be a portion of the second substrate 300 which does not overlap the first substrate 100. In this case, a lower surface of the second portion 302 of the second substrate 300 may be exposed.

In an embodiment, a thickness T2 of the second portion 302 may be less than a thickness T1 of the first portion 301. The thickness T1 of the first portion 301 may be the minimum distance from a lower surface to an upper surface of the first portion 301, and the thickness T2 of the second portion 302 may be the minimum distance from the lower surface to an upper surface of the second portion 302. For example, a height of the upper surface of the second portion 302 may be substantially equal to a height of the upper surface of the first portion 301, and a height of the lower surface of the second portion 302 may be higher than a height of the lower surface of the first portion 301.

In an embodiment, a difference between the thickness T1 of the first portion 301 and the thickness T2 of the second portion 302 may be greater than a thickness T3 of the printed circuit board 700. The thickness T3 of the printed circuit board 700 may be the minimum distance from a lower surface to an upper surface of the printed circuit board 700. For example, a value obtained by subtracting the thickness T2 of the second portion 302 from the thickness T1 of the first portion 301 may be greater than the thickness T3 of the printed circuit board 700.

The second substrate 300 may have a through-hole TH. The through-hole TH may penetrate the second substrate 300 in a thickness direction of the second substrate 300. The through-hole TH may be formed in the first portion 301 of the second substrate 300. The through-hole TH may expose the first line 200.

The second substrate 300 may expose an end portion of the first substrate 100 and an end portion of the first line 200. The first portion 301 of the second substrate 300 may not cover the end portion of the first substrate 100 and the end portion of the first line 200.

The second line 400 may be disposed on the second substrate 300. In an embodiment, at least one insulation layer may be interposed between the second line 400 and the second substrate 300.

The second line 400 may be electrically connected to the first line 200 through the through-hole TH. In an embodiment, the second line 400 may extend into the through-hole TH, and may contact the first line 200. In another embodiment, the second line 400 may be electrically connected to the first line 200 by a conductive member filling the through-hole TH.

The second line 400 may include a conductive material such as metal. The second line 400 may electrically connect the first line 200 and the display unit 500. The second line 400 may transmit an electrical signal from the printed circuit board 700 to the display unit 500. In an embodiment, the second line 400 may transmit a data signal, a control signal, a power voltage, or the like.

The display unit 500 may be disposed on the second substrate 300. The display unit 500 may be electrically connected to the second line 400. The display unit 500 may display an image based on a data signal, a control signal, a power voltage, or the like transmitted through the second line 400. In the first substrate 100 and the second substrate 300, an area in which the display unit 500 is disposed may be defined as a display area, and an area in which the display unit 500 is not disposed may be defined as a non-display area.

The encapsulation layer 600 may be disposed on the display unit 500. The encapsulation layer 600 may cover the display unit 500 on the second substrate 300. The encapsulation layer 600 may protect an upper portion of the display unit 500. In an embodiment, the encapsulation layer 600 may cover at least a portion of the second line 400.

The printed circuit board 700 may be disposed on a surface of the first substrate 100 which faces the second substrate 300. For example, the printed circuit board 700 may be disposed on an upper surface of the first substrate 100. The printed circuit board 700 may be disposed on the end portion of the first substrate 100 and the end portion of the first line 200. The printed circuit board 700 may be electrically connected to the first line 200. In an embodiment, the printed circuit board 700 may be electrically connected to the first line 200 by a conductive adhesive member such as an anisotropic conductive film.

The printed circuit board 700 may be rigid or flexible. The printed circuit board 700 may generate a data signal, a control signal, a power voltage, or the like. For example, the printed circuit board 700 may include a timing controller, a power supply, or the like.

The printed circuit board 700 may not overlap the display unit 500. The display unit 500 may be disposed on the second substrate 300, and the printed circuit board 700 may be disposed on the upper surface of the first substrate 100 on which the second substrate 300 is not disposed. Accordingly, the printed circuit board 700 may be disposed in the non-display area.

Figure 4:
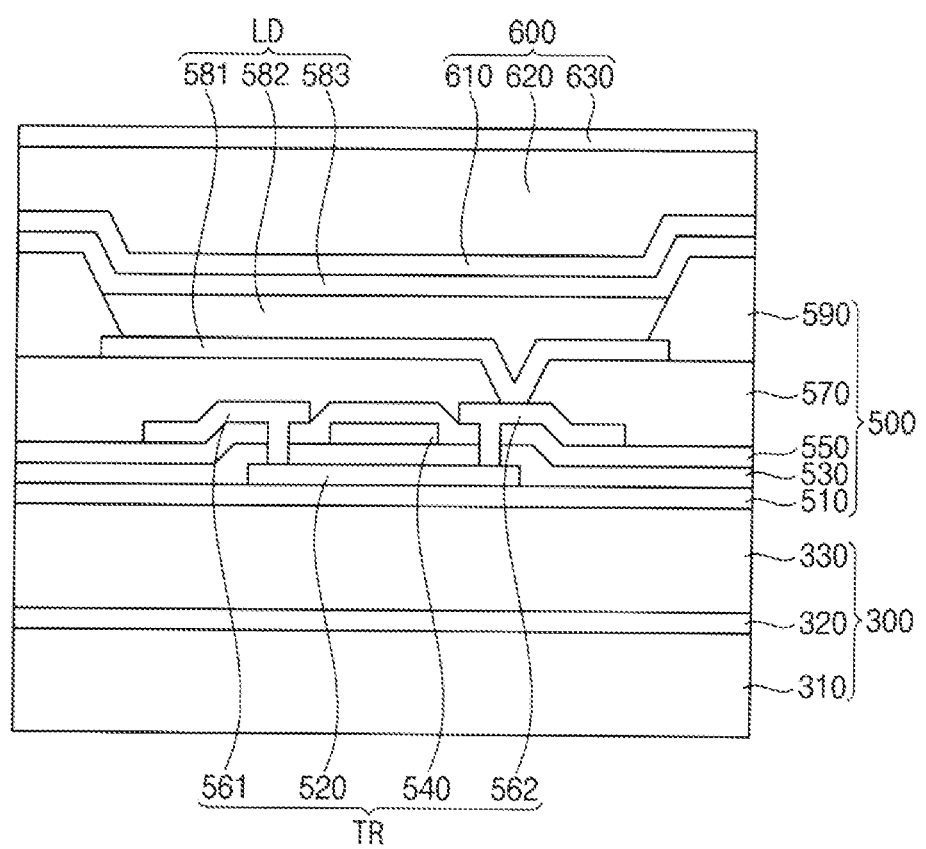
FIG. 4 is a cross-sectional view illustrating a second substrate, a display unit, and an encapsulation layer of the display panel in FIG. 3.

FIG. 4 is a cross-sectional view illustrating the second substrate 300, the display unit 500, and the encapsulation layer 600 of the display panel 10 in FIG. 3.

Referring to FIGS. 3 and 4, the second substrate 300 may have a multilayer structure. In an embodiment, the second substrate 300 may include a first substrate layer 310, a barrier layer 320, and a second substrate layer 330. The second substrate layer 330 may be disposed between the first substrate layer 310 and the display unit 500. The barrier layer 320 may be disposed between the first substrate layer 310 and the second substrate layer 330.

Each of the first substrate layer 310 and the second substrate layer 330 may include polymer resin. For example, the polymer resin may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), or the like. The barrier layer 320 may include an inorganic insulating material. For example, the inorganic insulating material may include silicon oxide, silicon nitride, silicon oxynitride, or the like. The barrier layer 320 may have a single-layer structure or a multilayer structure.

In an embodiment, the display unit 500 may include a buffer layer 510, a semiconductor layer 520, a gate insulation layer 530, a gate electrode 540, an insulation interlayer 550, a source electrode 561, a drain electrode 562, a planarization layer 570, a first electrode 581, a pixel defining layer 590, an emission layer 582, and a second electrode 583.

The buffer layer 510 may be disposed on the second substrate 300. The buffer layer 510 may block impurities from flowing through the first substrate 100 and the second substrate 300. Further, the buffer layer 510 may provide a flat upper surface on the second substrate 300. The buffer layer 510 may include an inorganic insulating material such as silicon nitride, silicon oxide, silicon oxynitride, or the like.

The semiconductor layer 520 may be disposed on the buffer layer 510. In an embodiment, the semiconductor layer 520 may include amorphous silicon, polycrystalline silicon, or the like. In another embodiment, the semiconductor layer 520 may include an oxide semiconductor. For example, the oxide semiconductor may include an oxide of at least one of indium (In), gallium (Ga), zinc (Zn), tin (Sn), titanium (Ti), zirconium (Zr), and hafnium (Hf).

The gate insulation layer 530 may be disposed on the semiconductor layer 520. The gate insulation layer 530 may cover the semiconductor layer 520 on the buffer layer 510. In an embodiment, the gate insulation layer 530 may have a uniform thickness along the profile of the semiconductor layer 520. In another embodiment, the gate insulation layer 530 may have a flat upper surface. The gate insulation layer 530 may include an inorganic insulating material such as silicon nitride, silicon oxide, silicon oxynitride, or the like.

The gate electrode 540 may be disposed on the gate insulation layer 530. The gate electrode 540 may overlap the semiconductor layer 520. The gate electrode 540 may include a conductive material such as molybdenum (Mo), copper (Cu), aluminum (Al), titanium (Ti), or the like. The gate electrode 540 may have a single-layer structure or a multilayer structure.

The insulation interlayer 550 may be disposed on the gate electrode 540. The insulation interlayer 550 may cover the gate electrode 540 on the gate insulation layer 530. In an embodiment, the insulation interlayer 550 may have a uniform thickness along the profiles of the gate insulation layer 530 and the gate electrode 540. In another embodiment, the insulation interlayer 550 may have a flat upper surface. The insulation interlayer 550 may include an inorganic insulating material such as silicon nitride, silicon oxide, silicon oxynitride, or the like.

The source electrode 561 and the drain electrode 562 may be disposed on the insulation interlayer 550. Each of the source electrode 561 and the drain electrode 562 may be connected to the semiconductor layer 520 through contact holes formed in the gate insulation layer 530 and the insulation interlayer 550. Each of the source electrode 561 and the drain electrode 562 may include a conductive material such as molybdenum (Mo), copper (Cu), aluminum (Al), titanium (Ti), or the like. Each of the source electrode 561 and the drain electrode 562 may have a single-layer structure or a multilayer structure. The semiconductor layer 520, the gate electrode 540, the source electrode 561, and the drain electrode 562 may form a transistor TR.

The second line 400 may include the same material as at least one of the gate electrode 540, the source electrode 561, and the drain electrode 562.

In an embodiment, the second line 400 may include the same material as the gate electrode 540. In such an embodiment, the second line 400 may be disposed on the same layer as the gate electrode 540. For example, the second line 400 may be disposed on the gate insulation layer 530.

In an embodiment, the second line 400 may include the same material as the source electrode 561 and the drain electrode 562. In such an embodiment, the second line 400 may be disposed on the same layer as the source electrode 561 and the drain electrode 562. For example, the second line 400 may be disposed on the insulation interlayer 550.

The planarization layer 570 may be disposed on the source electrode 561 and the drain electrode 562. The planarization layer 570 may cover the source electrode 561 and the drain electrode 562 on the insulation interlayer 550. The planarization layer 570 may have a flat upper surface. The planarization layer 570 may include an organic insulating material such as polyimide (PI) or the like.

The first electrode 581 may be disposed on the planarization layer 570. The first electrode 581 may be connected to the source electrode 561 or the drain electrode 562 through a contact hole formed in the planarization layer 570. In an embodiment, as illustrated in FIG. 4, the first electrode 581 may be connected to the drain electrode 562. However, the present invention is not limited thereto, and in another embodiment, the first electrode 581 may be connected to the source electrode 561. The first electrode 581 may include a conductive material such as a metal, an alloy, a transparent conductive oxide, or the like. In an embodiment, the first electrode 581 may include silver (Ag) and indium tin oxide (ITO).

The pixel defining layer 590 may be disposed on the first electrode 581. The pixel defining layer 590 may partially cover the first electrode 581 on the planarization layer 570. The pixel defining layer 590 may have a pixel opening exposing at least a portion of the first electrode 581. In an embodiment, the pixel opening may expose a central portion of the first electrode 581, and the pixel defining layer 590 may cover a peripheral portion of the first electrode 581. The pixel defining layer 590 may have a flat upper surface. The pixel defining layer 590 may include an organic insulating material such as polyimide (PI) or the like.

The emission layer 582 may be disposed on the first electrode 581. The emission layer 582 may be disposed on the first electrode 581 exposed by the pixel opening. The emission layer 582 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, or the like. The high molecular weight organic compound may include poly(3,4-ethylenedioxythiophene), polyaniline, polyphenylenevinylene, polyfluorene, or the like.

In an embodiment, the quantum dot may include a core including a group II-VI compound, a group III-V compound, a group IV-VI compound, a group IV element, a group IV compound, or combinations thereof. In an embodiment, the quantum dot may have a core-shell structure including a core and a shell surrounding the core. The shell may serve as a protective layer for maintaining semiconductor properties by preventing chemical modification of the core and as a charging layer for imparting electrophoretic properties to the quantum dot.

The second electrode 583 may be disposed on the emission layer 582 and the pixel defining layer 590. The second electrode 583 may include a conductive material such as a metal, an alloy, a transparent conductive oxide, or the like. For example, the conductive material may include aluminum (Al), platinum (Pt), silver (Ag), magnesium (Mg), gold (Au), chromium (Cr), tungsten (W), titanium (Ti), or the like.

The first electrode 581, the emission layer 582, and the second electrode 583 may form a light emitting element LD. The light emitting element LD may be electrically connected to the transistor TR.

The encapsulation layer 600 may include at least one inorganic encapsulation layer and at least one organic encapsulation layer which are stacked. In an embodiment, the encapsulation layer 600 may include a first inorganic encapsulation layer 610, an organic encapsulation layer 620, and a second inorganic encapsulation layer 630. The first inorganic encapsulation layer 610 may be disposed on the second electrode 583. The second inorganic encapsulation layer 630 may be disposed on the first inorganic encapsulation layer 610. The organic encapsulation layer 620 may be disposed between the first inorganic encapsulation layer 610 and the second inorganic encapsulation layer 630.

Each of the first inorganic encapsulation layer 610 and the second inorganic encapsulation layer 630 may include an inorganic material. For example, the inorganic material may include at least one of $Al_2O_3$, $TiO_2$, $ZrO$, $SiO_2$, AlON, AlN, SiON, $Si_3N_4$, ZnO, and $Ta_2O_5$. Each of the first inorganic encapsulation layer 610 and the second inorganic encapsulation layer 630 may be formed by chemical vapor deposition (CVD) or atomic layer deposition (ALD). The first inorganic encapsulation layer 610 and the second inorganic encapsulation layer 630 may block penetration of moisture or oxygen.

The organic encapsulation layer 620 may include a polymer-based material. For example, the polymer-based material may include acrylic resin, epoxy resin, polyimide, polyethylene, or the like. The organic encapsulation layer 620 may be formed by a thermal evaporation process.

Figure 5:
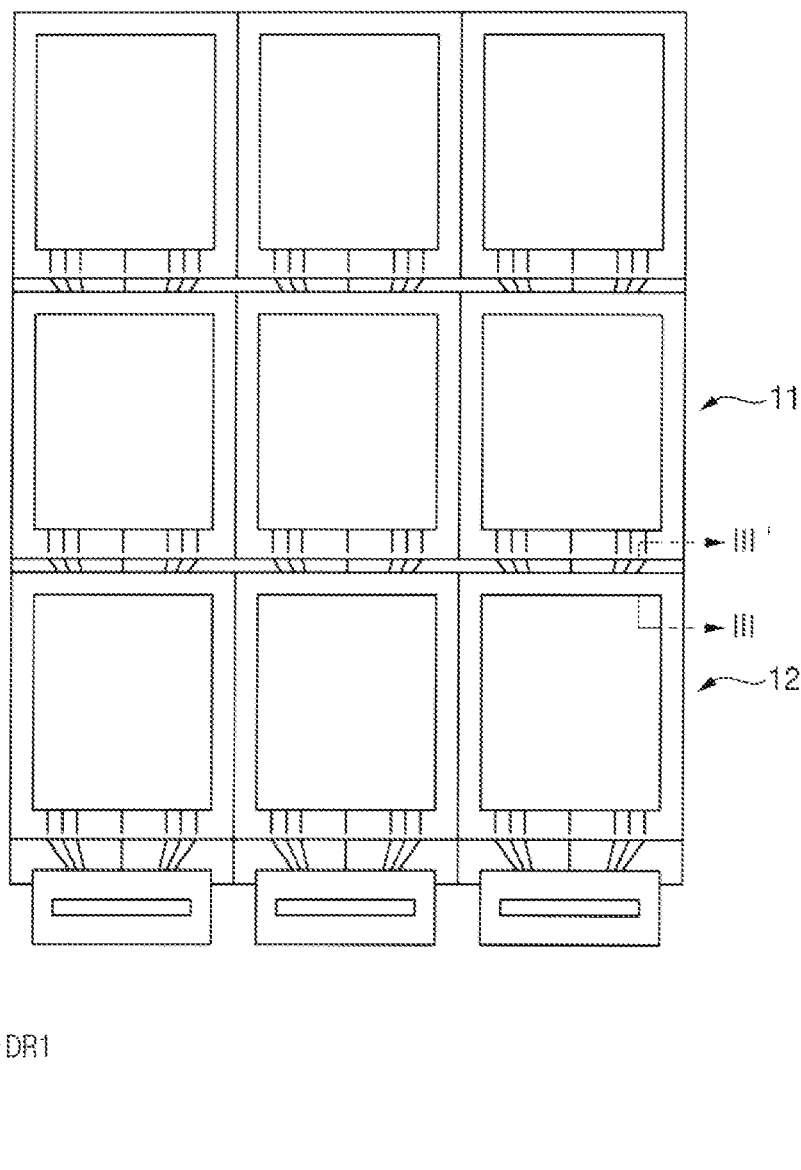
FIG. 5 is a diagram illustrating a front side of a display device according to an embodiment.
Figure 6:
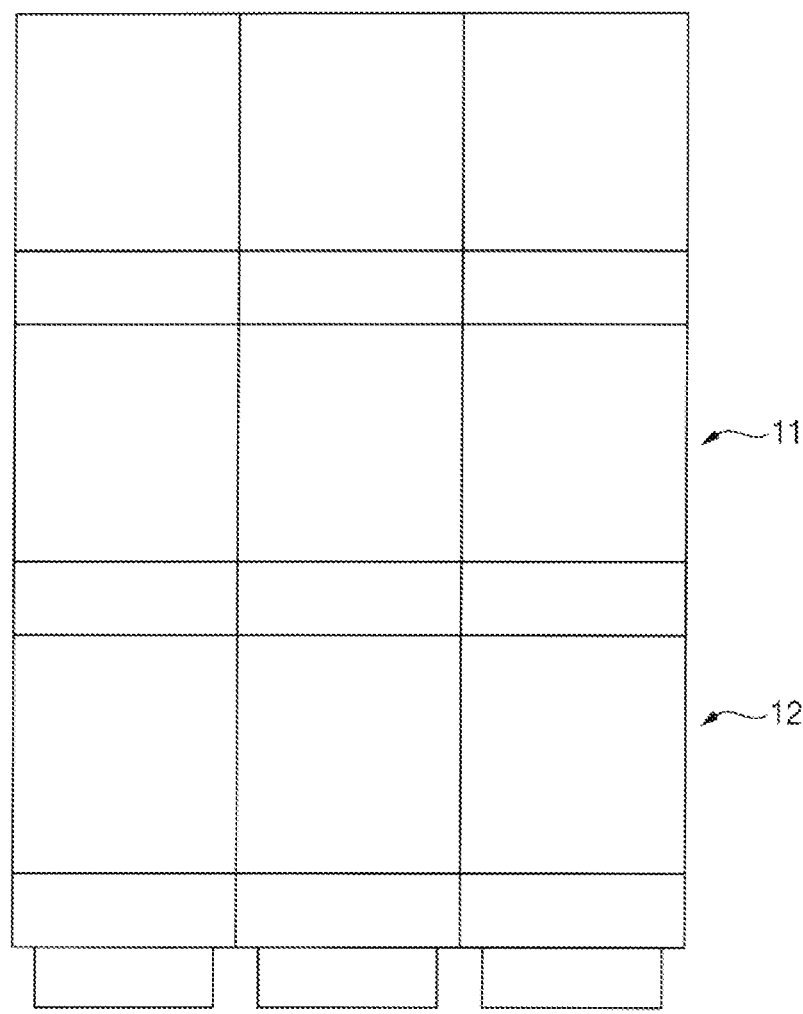
FIG. 6 is a diagram illustrating a bottom side of the display device in FIG. 5.
Figure 6:
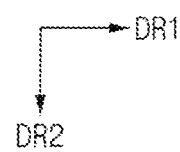
Figure 7:
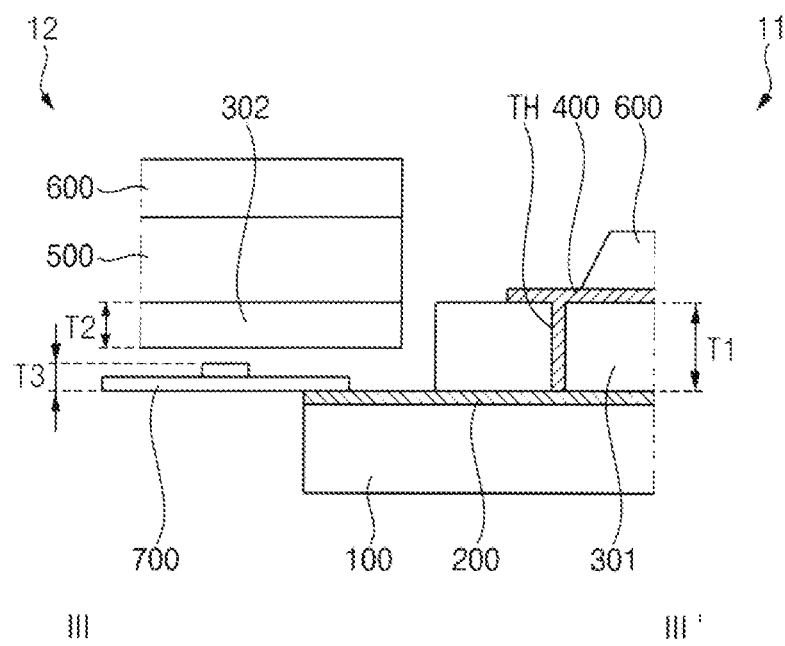
FIG. 7 is a cross-sectional view illustrating the display device taken along a line in FIG. 5.

FIG. 5 is a diagram illustrating a front side of a display device 1 according to an embodiment. FIG. 6 is a diagram illustrating a bottom side of the display device 1 in FIG. 5. FIG. 7 is a cross-sectional view illustrating the display device 1 taken along a line in FIG. 5.

Referring to FIGS. 5, 6, and 7, a display device 1 may be a tiled display device including a plurality of display panels. The display panels may be arranged in a first direction DR1 and a second direction DR2 crossing the first direction DR1. Each of the display panels may be substantially the same as the display panel 10 described with reference to FIGS. 1 to 4.

In an embodiment, the display device 1 may include nine display panels arranged in a 3×3 matrix. However, the number and arrangement of the display panels of the display device of the embodiments described herein are not limited thereto. As the display device 1 includes the display panels, the display device 1 may provide an image of a large screen.

The display panels may include a first display panel 11 and a second display panel 12 adjacent to the first display panel 11 in the second direction DR2. Hereinafter, the display device 1 will be described with reference to the first display panel 11 and the second display panel 12.

Each of the first display panel 11 and the second display panel 12 may include the first substrate 100, the first lines 200, the second substrate 300, the second lines 400, the display unit 500, the encapsulation layer 600, and the printed circuit board 700. Since the components of each of the first display panel 11 and the second display panel 12 are substantially the same as those of the display panel 10 described with reference to FIGS. 1 to 4, a detailed description thereof will not be repeated.

The printed circuit board 700 of the first display panel 11 may overlap the second display panel 12. In an embodiment, the printed circuit board 700 of the first display panel 11 may overlap the second portion 302 of the second substrate 300 of the second display panel 12. Although the height of the lower surface of the first portion 301 of the second substrate 300 and the lower surface of the printed circuit board 700 are substantially equal, because the difference between the thickness T1 of the first portion 301 of the second substrate 300 and the thickness T2 of the second portion 302 of the second substrate 300 is greater than the thickness T3 of the printed circuit board 700, the printed circuit board 700 of the first display panel 11 may overlap the second portion 302 of the second substrate 300 of the second display panel 12. Further, the printed circuit board 700 of the first display panel 11 may be spaced apart from the second portion 302 of the second substrate 300 of the second display panel 12. Accordingly, the printed circuit board 700 of the first display panel 11 may not be damaged by the second portion 302 of the second substrate 300 of the second display panel 12.

In an embodiment, the printed circuit board 700 of the first display panel 11 may not overlap the first portion 301 of the second substrate 300 of the second display panel 12. Accordingly, the printed circuit board 700 of the first display panel 11 may be spaced apart from the first portion 301 of the second substrate 300 of the second display panel 12. Accordingly, the printed circuit board 700 of the first display panel 11 may not be damaged by the first portion 301 of the second substrate 300 of the second display panel 12.

In the display device 1 according to the embodiments described herein, the printed circuit board 700 of the first display panel 11 may overlap the second display panel 12, so that a distance between the first display panel 11 and the second display panel 12 may decrease. Accordingly, a seamless tiled display device in which a non-display area between the first display panel 11 and the second display panel 12 is not recognized may be implemented.

FIGS. 8 to 16 are cross-sectional views illustrating a method of manufacturing a s display panel 10 according to an embodiment.

Figure 8:
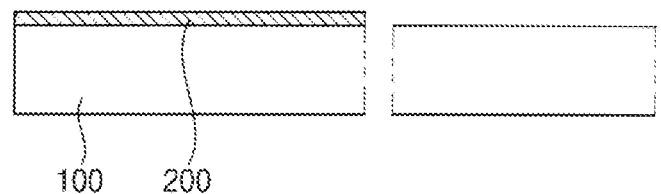
FIGS. 8, 9, 10, 11, 12, 13, 14, 15, and 16 are cross-sectional views illustrating a method of manufacturing a display panel according to an embodiment.

Referring to FIG. 8, the first line 200 may be formed on the first substrate 100. For example, the first line 200 may be formed by forming a conductive layer on the first substrate 100 and patterning the conductive layer by a photolithography process.

Figure 9:
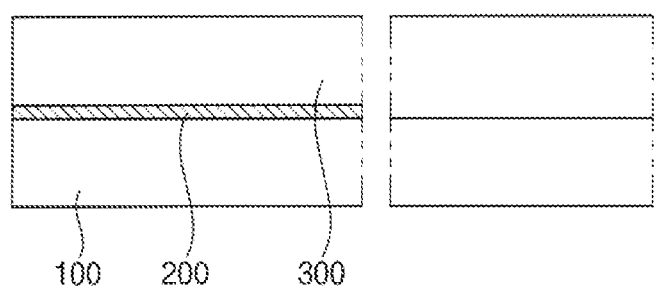

Referring to FIG. 9, the second substrate 300 may be formed on the first line 200. The second substrate 300 may be formed to cover the first line 200 on the first substrate 100.

Figure 10:
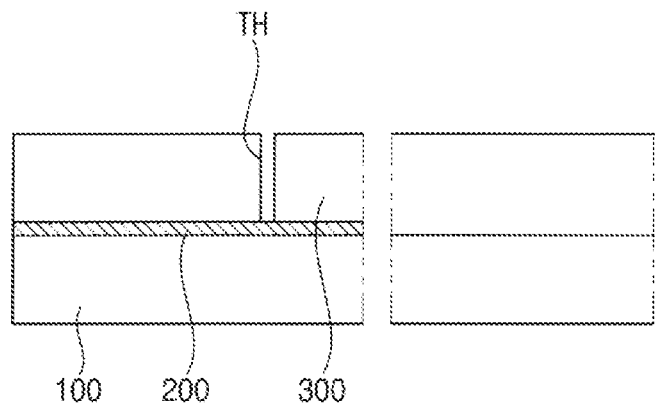

Referring to FIG. 10, the through-hole TH may be formed in the second substrate 300. For example, the through-hole TH may be formed by an etching process, a laser irradiation, or the like. The through-hole TH may expose the first line 200.

Figure 11:
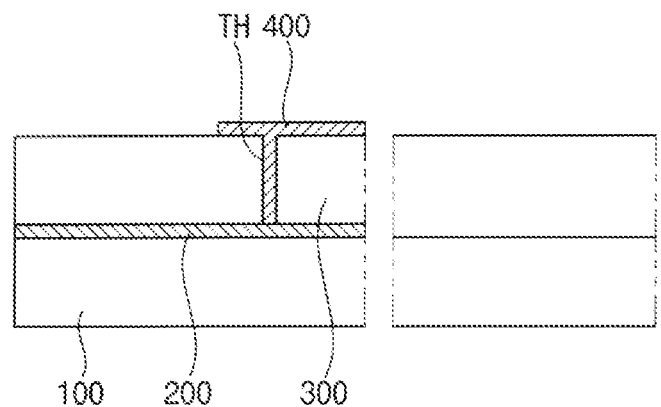

Referring to FIG. 11, the second line 400 may be formed on the second substrate 300. In an embodiment, the second line 400 may contact the first line 200 through the through-hole TH. For example, the second line 400 may be formed by forming a conductive layer extending into the through-hole TH on the second substrate 300 and patterning the conductive layer by a photolithography process. In another embodiment, the second line 400 may be electrically connected to the first line 200 through a conductive member filling the through-hole TH. For example, after the conductive member filling the through-hole TH is formed, a conductive layer may be formed on the second substrate 300, and the conductive layer may be patterned by a photolithography process to form the second line 400.

Figure 12:
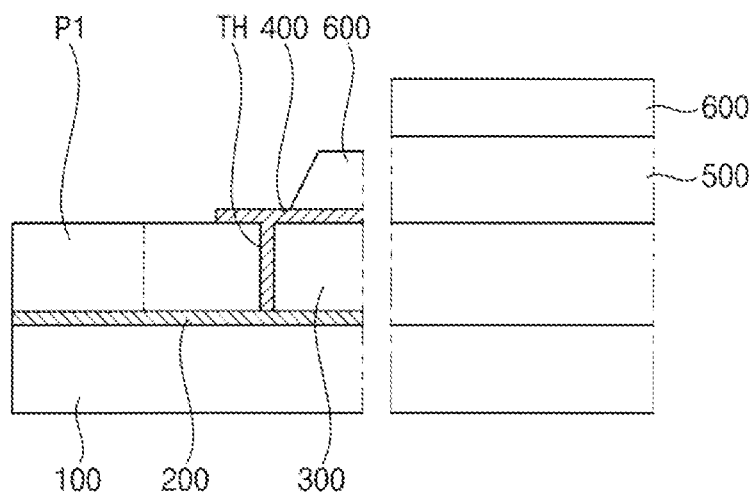

Referring to FIG. 12, the display unit 500 and the encapsulation layer 600 may be formed on the second substrate 300. The display unit 500 may be formed on the second substrate 300, and the encapsulation layer 600 may be formed on the display unit 500 to cover at least a portion of the second line 400.

Figure 13:
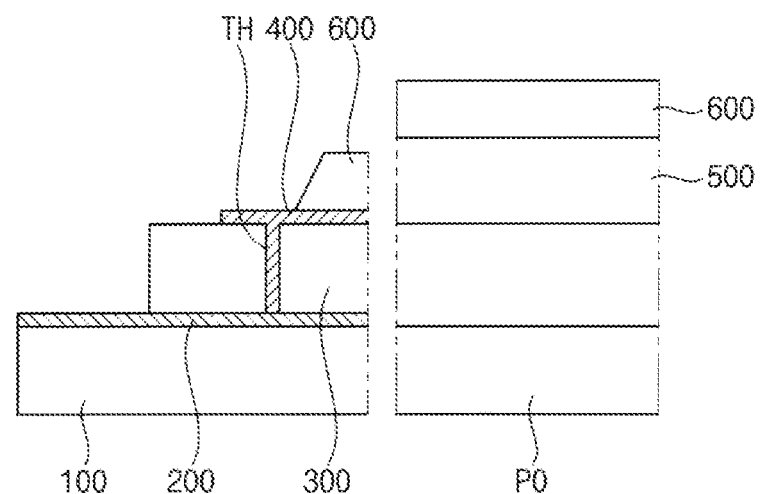

Referring to FIG. 13, a first portion P1 of the second substrate 300 may be removed. The first portion P1 may be a portion that covers the first line 200, and as the first portion P1 is removed, the first line 200 may be exposed. The first portion P1 of the second substrate 300 may be an end portion of the second substrate 300. In an embodiment, the first portion P1 of the second substrate 300 may be removed by an etching process.

Figure 14:
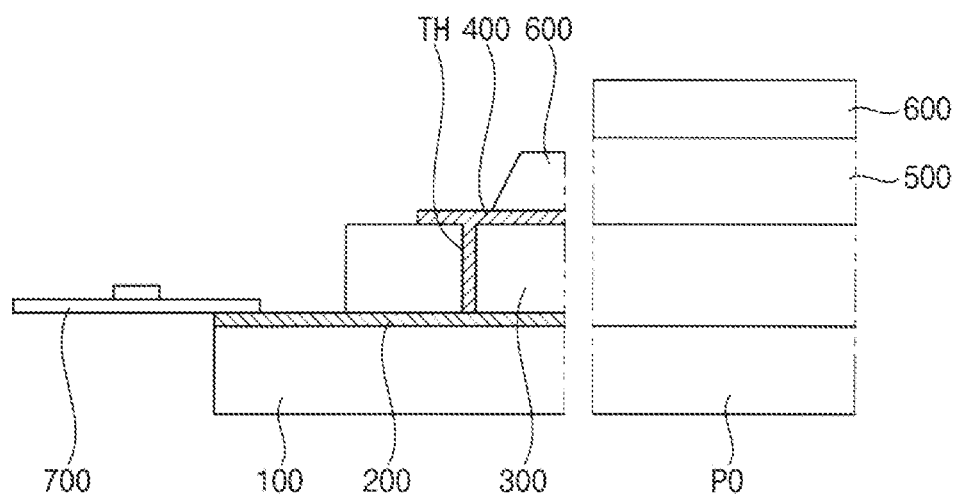

Referring to FIG. 14, the printed circuit board 700 may be bonded on a surface of the first substrate 100 which faces the second substrate 300. Specifically, the printed circuit board 700 may be bonded to an upper surface of the first substrate 100 corresponding to the removed first portion P1 of the second substrate 300. Accordingly, the printed circuit board 700 may be electrically connected to the first line 200.

In a method of manufacturing a display panel according to the prior art, a printed circuit board may be bonded to a display area on a lower surface of the display panel to decrease a non-display area of the display panel. In the prior art, the display area of the display panel may be damaged due to heat, pressure, or the like during the bonding process of the printed circuit board. Further, the display panel may be turned over in order to bond the printed circuit board to the lower surface of the display panel. In the prior art, an additional protective substrate may be required to protect a display unit and an encapsulation layer of the display panel.

In the method of manufacturing the display panel according to the embodiment described herein, the printed circuit board 700 may be bonded to the surface of the first substrate 100 which faces the second substrate 300, so that the printed circuit board 700 may be bonded to the non-display area of the display panel. Accordingly. the display area of the display panel may not be damaged. Further, since the display panel is not turned over for bonding the printed circuit board 700, an additional protective substrate for protecting the display unit 500 and the encapsulation layer 600 of the display panel may not be required.

Figure 15:
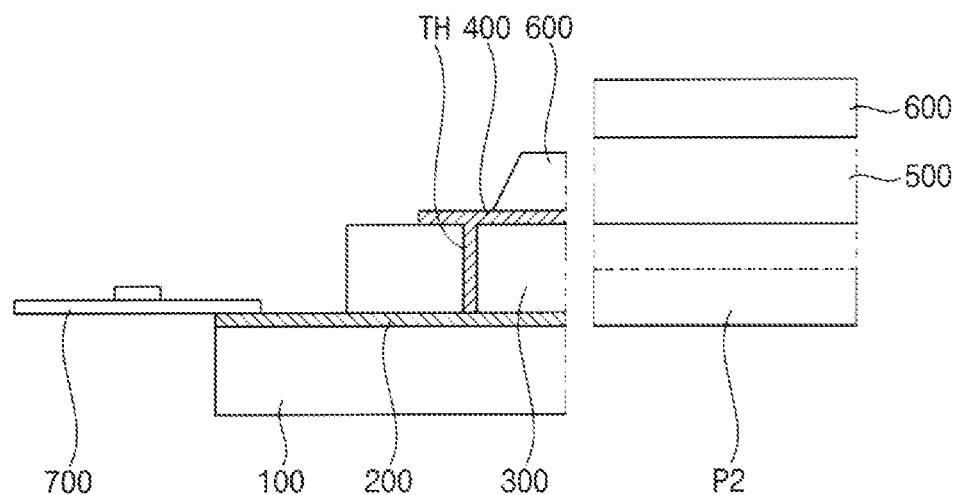

Referring to FIG. 15, a portion of the first substrate 100 which does not overlap the first line 200 may be removed. In an embodiment, the portion of the first substrate 100 may be removed by a cutting process. However, the embodiments described herein are not limited thereto, and in another embodiment, the portion of the first substrate 100 may be removed by an etching process.

Figure 16:
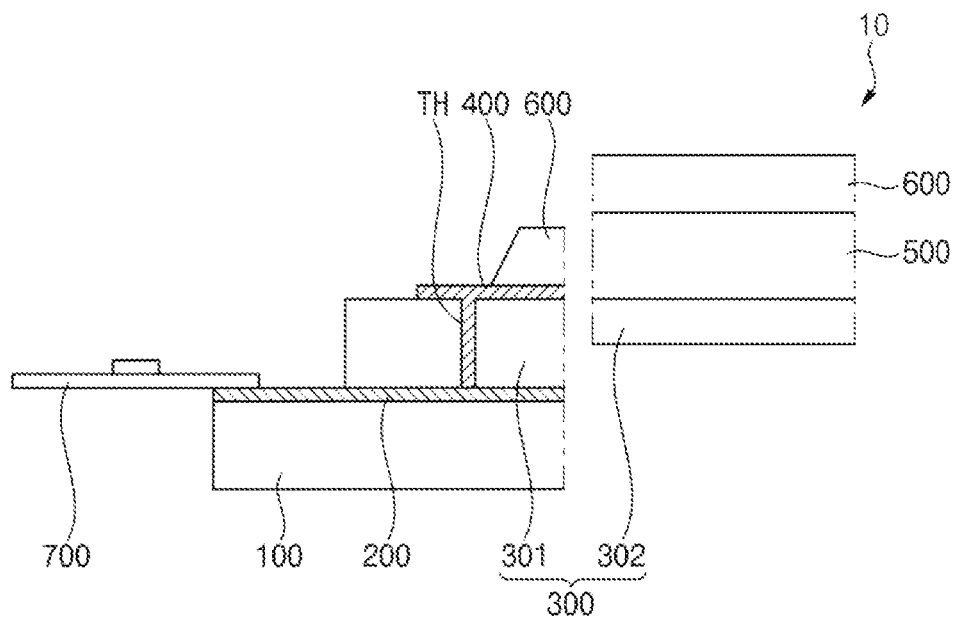

Referring to FIG. 16, a lower part of a second portion P2 of the second substrate 300 may be removed. The second portion P2 of the second substrate 300 may overlap the removed portion of the first substrate 100. A thickness of the removed lower part of the second portion P2 of the second substrate 300 may be greater than a thickness of the printed circuit board 700.

The display panel according to the embodiments may be applied to a display device included in a computer, a notebook, a mobile phone, a smart phone, a smart pad, a PMP, a PDA, an MP3 player, or the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:
   a first substrate;
   a first line disposed on the first substrate;
   a second substrate disposed on the first line, including a first portion which overlaps the first substrate and a second portion which does not overlap the first substrate, and having a through-hole which exposes the first line;
   a second line disposed on the second substrate and electrically connected to the first line through the through-hole;
   a display unit disposed on the second substrate and electrically connected to the second line; and
   a printed circuit board disposed on a surface of the first substrate which faces the second substrate and electrically connected to the first line.

2. The display panel of claim 1, wherein the printed circuit board does not overlap the display unit.

3. The display panel of claim 1, wherein the first substrate includes glass.

4. The display panel of claim 1, wherein a thickness of the second portion is less than a thickness of the first portion.

5. The display panel of claim 4, wherein a difference between the thickness of the first portion and the thickness of the second portion is greater than a thickness of the printed circuit board.

6. The display panel of claim 1, wherein the second substrate includes polymer resin.

7. The display panel of claim 6, wherein the second substrate includes:
   a first substrate layer including the polymer resin;
   a second substrate layer disposed between the first substrate and the display unit and including the polymer resin; and
   a barrier layer disposed between the first substrate layer and the second substrate layer.

8. The display panel of claim 1, wherein the display unit includes:
   a transistor including semiconductor layer, a gate electrode, a source electrode, and a drain electrode; and
   a light emitting element electrically connected to the transistor.

9. The display panel of claim 8, wherein the second line includes a same material as at least one of the gate electrode, the source electrode, and the drain electrode.

10. A display device, comprising:
    a first display panel; and
    a second display panel adjacent to the first display panel,
    wherein each of the first display panel and the second display panel includes:
       a first substrate;
       a first line disposed on the first substrate;
       a second substrate disposed on the first line, including a first portion which overlaps the first substrate and a second portion which does not overlap the first substrate, and having a through-hole which exposes the first line;
       a second line disposed on the second substrate and electrically connected to the first line through the through-hole;
       a display unit disposed on the second substrate and electrically connected to the second line; and
       a printed circuit board disposed on a surface of the first substrate which faces the second substrate and electrically connected to the first line, and
    wherein the printed circuit board of the first display panel overlaps the second display panel.

11. The display device of claim 10, wherein a thickness of the second portion is less than a thickness of the first portion.

12. The display device of claim 11, wherein the printed circuit board of the first display panel overlaps the second portion of the second substrate of the second display panel.

13. The display device of claim 12, wherein the printed circuit board of the first display panel is spaced apart from the second portion of the second substrate of the second display panel.

14. The display device of claim 10, wherein the printed circuit board of the first display panel does not overlap the first substrate of the second display panel.

* * * * *